(12) United States Patent  
Patel

(10) Patent No.: US 7,683,809 B2
(45) Date of Patent: Mar. 23, 2010

(54) ADVANCED LOSSLESS BIT CODING

(75) Inventor: Pankaj Patel, San Jose, CA (US)

(73) Assignee: Aceurity, Inc., Fremont, CA (US)

( * ) Notice: Subject to any disclaimer, the term of this patent is extended or adjusted under 35 U.S.C. 154(b) by 27 days.

(21) Appl. No.: 12/101,823

(22) Filed: Apr. 11, 2008

(65) Prior Publication Data

US 2009/0256730 A1   Oct. 15, 2009

(51) Int. Cl.
H03M 5/00 (2006.01)
(52) U.S. Cl. .......................... 341/52; 341/53
(58) Field of Classification Search .......... 341/65, 341/59, 51, 53, 106, 52; 382/233, 253; 710/65, 710/68
See application file for complete search history.

(56) References Cited

U.S. PATENT DOCUMENTS

| | | | |
|---|---|---|---|
| 7,024,046 B2 | 4/2006 | Dekel et al. | |
| 7,039,242 B2 | 5/2006 | Ueno | |
| 7,050,495 B2 | 5/2006 | Mihara et al. | |
| 7,068,849 B2 | 6/2006 | Zandi et al. | |
| 7,088,868 B1 | 8/2006 | Lidman | |
| 7,111,094 B1* | 9/2006 | Liu et al. | 710/65 |
| 7,148,925 B2 | 12/2006 | Osada et al. | |
| 7,158,680 B2 | 1/2007 | Pace | |
| 7,167,592 B2 | 1/2007 | Zandi et al. | |
| 7,190,284 B1* | 3/2007 | Dye et al. | 341/51 |
| 7,194,139 B1 | 3/2007 | Sariel et al. | |
| 7,215,820 B2 | 5/2007 | Zandi et al. | |
| 7,236,638 B2 | 6/2007 | Aggarwal | |
| 7,283,684 B1 | 10/2007 | Keenan | |
| 7,310,370 B2 | 12/2007 | Faroudja | |
| 7,313,272 B2 | 12/2007 | Miyanohara et al. | |
| 7,327,894 B2 | 2/2008 | Moore | |
| 7,330,587 B2 | 2/2008 | Drebin et al. | |
| 7,330,595 B2 | 2/2008 | Park et al. | |
| 7,336,720 B2 | 2/2008 | Martemyanov et al. | |
| 7,336,747 B2 | 2/2008 | Gruenberg et al. | |
| 7,343,037 B1 | 3/2008 | Kadatch | |
| 7,343,043 B2 | 3/2008 | Yokonuma | |
| 7,375,662 B2* | 5/2008 | Wilson et al. | 341/106 |
| 2007/0140569 A1 | 6/2007 | Tabuchi et al. | |
| 2007/0183675 A1 | 8/2007 | Morohashi | |
| 2008/0037880 A1 | 2/2008 | Lai | |
| 2008/0056348 A1 | 3/2008 | Lyashevsky et al. | |

* cited by examiner

*Primary Examiner*—Brian Young
(74) *Attorney, Agent, or Firm*—Blakely Sokoloff Taylor & Zafman LLP

(57) ABSTRACT

A bit coding method modifies the bit-steam information in such a way as to provide a very high compression during lossless symbol coding and may be used as a preprocessor for Huffman and arithmetic encodings or on its own. A bit rearrangement scheme (BRS) improves the run length within a data symbol set and achieves a more efficient data-to-symbol mapping. The BRS is implemented on the data symbol set in a column-by-column fashion. The BRS can be combined with any available lossless coding scheme, providing for a more efficient lossless bit coding scheme (ALBCS).

16 Claims, 12 Drawing Sheets

| Symbols 402 | | Symbol Code 405 |
|---|---|---|
| 1 0 1 0 | 10 | 0 0 0 0 0 |
| 1 1 0 0 | 12 | 0 0 0 0 1 |
| 1 0 1 1 | 11 | 0 0 0 1 |
| 0 0 1 1 | 3 | 0 0 1 |
| 0 0 0 0 | 0 | 0 1 |
| 1 0 0 0 | 8 | 1 0 |
| 0 0 1 0 | 2 | 1 1 |
| 28 | | 23 |

| Data Symbol set 401 for N=4 | Value | Coded symbol set 406 |
|---|---|---|
| 0000 | 0 | 0 1 |
| 0010 | 2 | 1 1 |
| 0010 | 2 | 1 1 |
| 0011 | 3 | 0 0 1 |
| 1011 | 11 | 0 0 0 1 |
| 0011 | 3 | 0 0 1 |
| 1010 | 10 | 0 0 0 0 0 |
| 0010 | 2 | 1 1 |
| 1000 | 8 | 1 0 |
| 0000 | 0 | 0 1 |
| 1100 | 12 | 0 0 0 0 1 |
| 0000 | 0 | 0 1 |
| 1000 | 8 | 1 0 |
| 1000 | 8 | 1 0 |
| 1000 | 8 | 1 0 |
| 0000 | 0 | 0 1 |
| Total Bits | 64 | 42 |

Result 407

| | |
|---|---|
| Symbols 402 | 28 |
| Symbol Code 405 | 23 |
| Coded data 406 | 42 |
| Total | 93 bits |

FIGURE 4d (Prior Art)

Principle of Advanced Lossless Bit Coding Scheme (ALBC)

| N=4 bits Data symbol set 401 | Value | Ln=3 reduction data symbol set 501 | Value |
|---|---|---|---|
| 0000 | 0 | 0000 | 0 |
| 0010 | 2 | 0010 | 2 |
| 0010 | 2 | 0010 | 2 |
| 0011 | 3 | 0011 | 3 |
| 1011 | 11 | 1000 | 8 |
| 0011 | 3 | 0011 | 3 |
| 1010 | 10 | 1000 | 8 |
| 0010 | 2 | 0010 | 2 |
| 1000 | 8 | 1000 | 8 |
| 0000 | 0 | 0000 | 0 |
| 1100 | 12 | 1000 | 8 |
| 0000 | 0 | 0000 | 0 |
| 1000 | 8 | 1000 | 8 |
| 1000 | 8 | 1000 | 8 |
| 1000 | 8 | 1000 | 8 |
| 0000 | 0 | 0000 | 0 |
| | | 0011 | 3 |
| | | 0010 | 2 |
| | | 0000 | 0 |
| | | 0100 | 4 |
| | | 0000 | 0 |
| | | 0000 | 0 |
| | | 0000 | 0 |

L3 Symbol 502

| L3 Symbol | Value | freq. |
|---|---|---|
| 0000 | 0 | 8 |
| 0010 | 2 | 4 |
| 0011 | 3 | 3 |
| 0100 | 4 | 1 |
| 1000 | 8 | 7 |

L3 Codes = 4 bits

| Value | | L3 Code 503 |
|---|---|---|
| 0 | = | 1 |
| 8 | = | 01 |
| 2 | = | 001 |
| 3 | = | 0001 |
| 4 | = | 0000 |

FIGURE 5

Level 3 reduction of four bit data symbols.

| N=4 bits | Ln=3 | Value | Coded |
|---|---|---|---|
| 0000 | 0000 | 0 | 1 |
| 0010 | 0010 | 2 | 0 0 1 |
| 0010 | 0010 | 2 | 0 0 1 |
| 0011 | 0011 | 3 | 0 0 0 0 |
| <u>1011</u> | 1000 | 8 | 0 1 |
| 0011 | 0011 | 3 | 0 0 0 0 |
| <u>1010</u> | 1000 | 8 | 0 1 |
| 0010 | 0010 | 2 | 0 0 1 |
| <u>1000</u> | 1000 | 8 | 0 1 |
| 0000 | 0000 | 0 | 1 |
| <u>1100</u> | 1000 | 8 | 0 1 |
| 0000 | 0000 | 0 | 1 |
| <u>1000</u> | 1000 | 8 | 0 1 |
| <u>1000</u> | 1000 | 8 | 0 1 |
| <u>1000</u> | 1000 | 8 | 0 1 |
| 0000 | 0000 | 0 | 1 |
| | 0011 | 3 | 0 0 0 0 |
| | 0010 | 2 | 0 0 1 |
| | 0000 | 0 | 1 |
| | 0100 | 4 | 0 0 0 1 |
| | 0000 | 0 | 1 |
| | 0000 | 0 | 1 |
| | 0000 | 0 | 1 |

Total  64    50

0 = 1
8 = 01
2 = 001
4 = 0001
3 = 0000

Symbols

0 = 000
8 = 000
2 = 010
4 = 100
3 = 011

Repeat of symbol represents 8

Result

| Symbols | 15 |
|---|---|
| Coded data | 50 |
| Total | 65 bits |

Note 1: In the case of a 4 bit symbol stream, the maximum number of possible codes have been reduced from 16 to nine by using the level 3 coding scheme.

Note 2: This reduction process can be continued to achieve maximum runlength coding with number of codes being limitted at any Level by the formula $2^{Ln}+(n-Ln)$ as in Fig. 7

FIGURE 6

Onward Level Reduction of Data Symbols

| Data Symbol N=4 | Data Symbol Ln=3 | Value | Data SymbolL n=2 | Value | Data Symbol Ln=1 | Value |
|---|---|---|---|---|---|---|
| 0000 | 0000 | 0 | 0000 | 0 | 0000 | 0 |
| 0010 | 0010 | 2 | 0010 | 2 | 0010 | 2 |
| 0010 | 0010 | 2 | 0010 | 2 | 0010 | 2 |
| 0011 | 0011 | 3 | 0011 | 3 | 0010 | 2 |
| 1011 | 1000 | 8 | 1000 | 8 | 1000 | 8 |
| 0011 | 0011 | 3 | 0011 | 3 | 0010 | 2 |
| 1010 | 1000 | 8 | 1000 | 8 | 1000 | 8 |
| 0010 | 0010 | 2 | 0010 | 2 | 0010 | 2 |
| 1000 | 1000 | 8 | 1000 | 8 | 1000 | 8 |
| 0000 | 0000 | 0 | 0000 | 0 | 0000 | 0 |
| 1100 | 1000 | 8 | 1000 | 8 | 1000 | 8 |
| 0000 | 0000 | 0 | 0000 | 0 | 0000 | 0 |
| 1000 | 1000 | 8 | 1000 | 8 | 1000 | 8 |
| 1000 | 1000 | 8 | 1000 | 8 | 1000 | 8 |
| 1000 | 1000 | 8 | 1000 | 8 | 1000 | 8 |
| 0000 | 0000 | 0 | 0000 | 0 | 0000 | 0 |
|  | 0011 | 3 | 0011 | 3 | 0010 | 2 |
|  | 0010 | 2 | 0010 | 2 | 0010 | 2 |
|  | 0000 | 0 | 0000 | 0 | 0000 | 0 |
|  | 0100 | 4 | 0100 | 4 | 0100 | 4 |
|  | 0000 | 0 | 0000 | 0 | 0000 | 0 |
|  | 0000 | 0 | 0000 | 0 | 0000 | 0 |
|  | 0000 | 0 | 0000 | 0 | 0000 | 0 |
|  |  |  | 0000 | 0 | 0000 | 0 |
|  |  |  |  |  | 0000 | 0 |
|  |  |  |  |  | 0000 | 0 |
|  |  |  |  |  | 0001 | 1 |
|  |  |  |  |  | 0001 | 1 |
|  |  |  |  |  | 0000 | 0 |
|  |  |  |  |  | 0001 | 1 |
|  |  |  |  |  | 0000 | 0 |

FIGURE 8

| Ln=1 recovery operation. Data symbol set | Value | | Ln=2 recovery operation. Data symbol set | | Ln=3 recovery operation Data symbol set | | Recovered original Data symbol set |
|---|---|---|---|---|---|---|---|
| 1  0000 | 0 → | 1 | 0000 → | 1 | 0000 → | | 0000 |
| 2  0010 | 2 → +25 | 2 | 0010 → | 2 | 0010 → | | 0010 |
| 3  0010 | 2 → +26 | 3 | 0010 → | 3 | 0010 → | | 0010 |
| 4  0010 | 2 → +27 | 4 | 0011 → | 4 | 0011 → | | 0011 |
| 5  1000 | 8 → | 5 | 1000 → | 5 | 1000 → +17 | | 1011 |
| 6  0010 | 2 → +28 | 6 | 0011 → | 6 | 0011 → | | 0011 |
| 7  1000 | 8 → | 7 | 1000 → | 7 | 1000 → +18 | | 1010 |
| 8  0010 | 2 → +29 | 8 | 0010 → | 8 | 0010 → | | 0010 |
| 9  1000 | 8 → | 9 | 1000 → | 9 | 1000 → +19 | | 1000 |
| 10 0000 | 0 → | 10 | 0000 → | 10 | 0000 → | | 0000 |
| 11 1000 | 8 → | 11 | 1000 → | 11 | 1000 → +20 | | 1100 |
| 12 0000 | 0 → | 12 | 0000 → | 12 | 0000 → | | 0000 |
| 13 1000 | 8 → | 13 | 1000 → | 13 | 1000 → +21 | | 1000 |
| 14 1000 | 8 → | 14 | 1000 → | 14 | 1000 → +22 | | 1000 |
| 15 1000 | 8 → | 15 | 1000 → | 15 | 1000 → +23 | | 1000 |
| 16 0000 Original Last byte | 0 → | 16 | 0000 Original Last byte → | 16 | 0000 Original Last byte → | | 0000 |
| 17 0010 | 2 → +30 | 17 | 0011 → | 17 | ~~0011~~ | | |
| 18 0010 | 2 → +31 | 18 | 0010 → | 18 | ~~0010~~ | | |
| 19 0000 | 0 → | 19 | 0000 → | 19 | ~~0000~~ | | |
| 20 0100 | 4 → | 20 | 0100 → +24 | 20 | ~~0100~~ | | |
| 21 0000 | 0 → | 21 | 0000 → | 21 | ~~0000~~ | | |
| 22 0000 | 0 → | 22 | 0000 → | 22 | ~~0000~~ | | |
| 23 0000 | 0 → | 23 | 0000 → | 23 | ~~0000~~ | | |
| 24 0000 | 0 → | 24 | ~~0000~~ | | | | |
| ~~25~~ ~~0000~~ | 0 | | | | | | |
| ~~26~~ ~~0000~~ | 0 | | | | | | |
| ~~27~~ ~~0001~~ | 1 | | | | | | |
| ~~28~~ ~~0001~~ | 1 | | | | | | |
| ~~29~~ ~~0000~~ | 0 | | | | | | |
| ~~30~~ ~~0001~~ | 1 | | | | | | |
| ~~31~~ ~~0000~~ | 0 | | | | | | |

FIGURE 10

Number of possible Symbols after nth level reduction for an 8 bit data symbol stream using Advanced Lossless Bit coding (ALBC)

| | L7 | L6 | L5 | L4 | L3 | L2 | L1 |
|---|---|---|---|---|---|---|---|
| 0 | 0 | 0 | 0 | 0 | 0 | 0 | 0 |
| 1 | 1 | 1 | 1 | 1 | 1 | 1 | 1 |
| 2 | 2 | 2 | 2 | 2 | 2 | 2 | 2 |
| 3 | 3 | 3 | 3 | 3 | 3 | 3 | 4 |
| 4 | 4 | 4 | 4 | 4 | 4 | 4 | 8 |
| 5 | 5 | 5 | 5 | 5 | 5 | 8 | 16 |
| 6 | 6 | 6 | 6 | 6 | 6 | 16 | 32 |
| 7 | 7 | 7 | 7 | 7 | 7 | 32 | 64 |
| 8 | 8 | 8 | 8 | 8 | 8 | 64 | 128 |
| 9 | 9 | 9 | 9 | 9 | 16 | 128 | ↓ |
| 10 | 10 | 10 | 10 | 10 | 32 | ↓ | |
| - | - | - | - | - | 64 | | |
| - | - | - | - | - | 128 | | |
| - | - | - | - | - | ↓ | | |
| 14 | 14 | 14 | 14 | | | | |
| 15 | 15 | 15 | 15 | 15 | | | |
| 16 | 16 | 16 | 16 | 16 | | | |
| 17 | 17 | 17 | 17 | 32 | | | |
| 18 | 18 | 18 | 18 | 64 | | | |
| 19 | 19 | 19 | 19 | 128 | | | |
| - | - | - | - | ↓ | | | |
| 31 | 31 | 31 | 31 | | | | |
| 32 | 32 | 32 | 32 | | | | |
| 33 | 33 | 33 | 64 | | | | |
| 34 | 34 | 34 | 128 | | | | |
| - | - | - | ↓ | | | | |
| 63 | 63 | 63 | | | | | |
| 64 | 64 | 64 | | | | | |
| 65 | 65 | 128 | | | | | |
| - | - | ↓ | | | | | |
| 127 | 127 | | | | | | |
| 128 | 128 | | | | | | |
| - | ↓ | | | | | | |
| 254 | | | | | | | |
| 255 | | | | | | | |

| Max # codes: | 129 | 66 | 35 | 20 | 13 | 10 | 9 |

FIGURE 11

ADVANCED LOSSLESS BIT CODING

BACKGROUND OF THE INVENTION

1. Field of the Invention

Generally the invention is in the field of data and information coding for transmission and storage. More specifically it refers to lossless coding of video streams, lossless entropy coding, to achieve very high compression and throughput during video transmission and storage.

2. Prior Art

The aim of lossless coding is to represent a data stream using the smallest number of bits possible, without loss of any information contained in the data stream. Similarly the aim of lossless image coding is to represent an image signal using the least number of bits with no loss of information. This is a requirement for high-speed transmission and storage of data. In the case of a video stream this is represented as an average bits-per-second. The difference between lossy compression and lossless compression is that in the case of lossy compression the aim is to achieve a level of acceptable and predefined compression of the data stream with the best possible information content. Such a compression or coding will sustain some information loss that has to be evaluated for acceptance.

In all data streams it is possible to achieve a level of lossless compression. This is because there is redundancy present in the data streams. In the case of any image signal the redundancy can be significant. This redundancy is proportional to the correlation among the data samples. Typically between neighboring image samples, the difference will be small and the correlation very high. There is also a large correlation between adjacent frames of a video that can be used effectively to compress the digital stream.

Fully lossless coding of the decoded image has to be visually and numerically the same as the image that was coded. This requirement severely limits the possible compression ratio. In a video stream the aim is to provide a visually lossless video stream. Hence, removal of redundant data as well as removal of irrelevant data that does not impact the visual quality, leads to the achieving of higher compression. Even though lossy compression provides a much higher compression ratio, there are applications like medical imaging and others which require lossless transmission of information. In any application where the band width is fixed and compression needs are high, it is better to achieve a large lossless component of the final compression, if possible, and use a smaller range of lossy compression to improve the reliability of the transmitted data and image quality.

FIG. 1 shows a prior art lossless encoder 100 for image symbol coding. FIG. 2 shows a prior art decoder 200 that is used to regenerate the image from the encoded bit stream. The encoder 100 takes the input image 101 and transforms it in a transformation unit 102. The transformation unit 102 converts the input image 101 into a compressible stream of digital data. Typically the transformation unit 102 manipulates the image by reducing redundancy and enabling alteration of the statistical distribution for maximum compression. It also enables packing of information into few sub-regions or data samples. The aim of the transformation is to eliminate the inter-dependencies between the components of the input image or data. A typical encoder 100 will use one of differential predictive mapping (DPM), unitary transform such as discrete cosine transform (DCT), sub-band decompositions such as differential wavelet transform (DWT), or a combination of the abovementioned transform methods.

Within the encoder 100 a data-to-symbol mapping unit 103 is used to generate and map the digital data, generated by the transformation unit 102, into data symbols. Here the data is converted into a set of symbols that can be coded by the final coding stage 104. The symbol mapping unit 103 looks at the correlations between data blocks to improve the possible compression. Run length coding is one such mapping scheme commonly used. FIG. 3 shows a typical run length coding of data stream. It converts the input data 301 into a map of symbol pairs 302 of run and value. The value is the value of the data and the run is the number of times that value is repeated sequentially. Alternately coding schemes like JPEG use code values to code only the non-zero data value, and the run is used to code the number of zeros preceding each value. Most of these schemes depend on having a reasonably repetitive digital data to enable efficient coding and compression.

A lossless symbol encoding unit 104 then encodes these symbols to produce a bit stream 105 that is the encoded output. The encoding schemes for converting the data symbols to a symbol code stream commonly in use today include the well-known Huffman lossless symbol coding, the arithmetic lossless symbol coding, and the dictionary based symbol coding methods. These lossless coding schemes are typically referred to as entropy coding schemes.

The Huffman and the Arithmetic encoding schemes are based on understanding the statistical probability distribution of the data symbol set generated. The shorter codes are assigned to data symbols with higher probability of occurrence, that is, it is a variable length coding method. The alternate coding scheme, the dictionary based coding scheme, dynamically constructs the encoding and decoding tables of variable length symbols and uses them to generate code by lookup. In all these cases the code itself is variable and depends on the nature and repetitiveness of the data symbol set coded.

FIGS. 4a through 4d show a typical encoding using the Huffman coding scheme. A typical segment of the video data 400 is shown in FIG. 4a. The transformed data symbol set 401, which is 4 bit wide (N=4), is shown in FIG. 4a. Since there are four bits there can be as many as 16 individual symbols, though in the specific example shown not all the symbols are generated or used. The respective weights of the symbols in the data symbol set are compiled and combined as shown 402 also in FIG. 4a. The total weight is equal to the total occurrences and the ratio of occurrence of each element of data symbol set in the distribution. The construction 403 of the code tree with the code tree 404 is also shown in FIG. 4b. The symbols 404, generated from the data symbol set 401 and symbol codes (codes) 405, are shown in FIG. 4c. The resultant coded data symbol set 406 with the total bits to be sent is now shown in FIG. 4d. The sent information 407, in this case, requires the sending of symbols 402, the symbol code 405 and the coded symbol set 406 to enable extraction of the data set at the decoder. Since only 16 bytes are coded in the example, the repetitive nature is not substantial and the number of bits sent, 93 bits, is lager in the small example than the number of bits in the symbol set which is 64 bits.

The process of coding comprises the steps below:

1. The data set 400 is transformed into a data symbol set 401;

2. From the transformed data symbol set the individual symbols 402 and their weights are estimated as shown in FIG. 4a, where the total estimated weight of all symbols equals the total number of occurrences;

3. The symbols 402, are arranged in the order of weights, as shown in FIG. 4a, before combining the least occurring symbols;

4. A weighted structure 403 is built by connecting the least weights onward as shown in FIG. 4b, and repeating with other weights to achieve the final structure of the code tree 404;

5. From this code tree 404 the symbols codes 405 are extracted as indicated in FIG. 4c;

6. These symbol codes 405 are used to code the data symbol set 401 as shown in FIG. 4d, thereby producing the transmittable coded data 406;

7. The symbol code 405, the symbols 402 and the coded data set 406 are transmitted 407 to the receiver for decoding where the inverse process is to be used to recover the data-symbol set;

8. The Huffman coding requires an additional termination code to separate "Symbols", and "Symbol Code" due to variable length dependent upon number of codes generated; and, 9. The maximum number of codes generated is also variable depending on the inter-dependencies.

As defined in step seven above, the encoded output will be transmitted with the symbol code, symbols and coded data to the decoder 200. The decoder 200, once it receives the encoded bit stream 105 with the symbol code, symbols, and coded data, passes the bit stream through a lossless symbol decoding unit 202 to extract and decode the symbol. These symbols extracted are then passed to a symbol to data mapping unit 203 for mapping the symbol to data and regenerate the transformed data stream. This data stream is passed through an inverse transformation unit 204 to regenerate the input image 205 which is the same as the input image 100.

Due the inability of the transformation schemes like DCT and DWT to completely eliminate interdependencies from the transformed image or data stream, the full potential of compression is never achieved in entropy coding. It would be therefore valuable if a new method enabling the reduction of the interdependency, improving the run length and providing for a maximum number of fixed codes, be developed. It would be further advantageous if such scheme would improve the compression performance, i.e., provide better lossless compression. It will be further advantageous if such scheme would be compatible for use with the current prior art entropy coding schemes.

BRIEF DESCRIPTION OF THE DRAWINGS

FIGS. 4a through 4d are diagrammatic representations of a prior art example of lossless coding scheme using Huffman coding.

FIG. 5 is an illustration of the principle of the manipulation of data symbols for the proposed coding scheme to improve run length and reduce the number of codes.

FIG. 6 is the third level reduction of a four bit data.

FIG. 8 is the consecutive reduction of level 3, 2 and 1 of the proposed coding scheme.

FIG. 10 is the typical decoding scheme for recovery of the original symbol set from L1 coding of a 4 bit wide data symbol set.

FIG. 11 is the table showing the reduction in number of maximum codes generated with each level of reduction with an 8-bit wide data symbol set.

DETAILED DESCRIPTION OF THE PREFERRED EMBODIMENTS

A bit coding method modifies the bit-steam information in such a way as to provide a very high compression during lossless symbol coding and may be used as a preprocessor for Huffman and arithmetic encodings or on its own. A bit rearrangement scheme (BRS) improves the run length within a data symbol set and achieves a more efficient data-to-symbol mapping. The typical BRS is implemented on the data symbol set in a column-by-column fashion. This does not limit the BRS schemes of rearranging the data symbol set from using subtraction or addition or other logical operations in a similar fashion, either in a column sequence or in a row sequence to achieve run length and orthogonality as covered by this application. The BRS can be combined with any available lossless or lossy coding scheme to improve coding efficiency and compression. Specifically, the current invention therefore relates to modifying a transformed image or data by inserting a unique pre-processing scheme and subsequent coding that is a bit rearrangement scheme (BRS) providing for a more efficient and Advanced lossless bit coding scheme (ALBCS). This pre-processing scheme BRS further improves the run length within the data symbol set and achieves an efficient symbol to data mapping.

The ALBCS entropy coding can be explained as a processing scheme that allows the data symbols to be further preprocessed to achieve a larger level of redundancy and orthogonality. It can be used effectively as a stand-alone scheme. It can also be combined with prior art statistical coding schemes, like Huffman, arithmetic coding or other coding methods, to improve the coding efficiency of such methods. In all these cases it will provide a set of codes, that is limited within a fixed code set, that are pre-defined and is not random or variable. The code set is only based on the number of data symbols and not on randomness of data. As can be shown any subset of codes are also fixed for a set of symbols used and hence, in a typical transmission, this code itself does not need to be transmitted. Only the symbols need to be sent in the order of their weights. It can also be used with prior art run length coding of repeating symbols to improve coding efficiency.

FIG. 5 shows the principle of the disclosed invention for the manipulation of the data symbols. It shows how to achieve the run length and orthogonality needed for a high-degree of compression during the lossless coding of the data symbols. The preprocessing of the data symbol set is a sequential process that starts with manipulation of the first data symbol of the data symbol set. The first set of manipulations is a repetitive process for all the symbols based on the most significant bit (MSB) which is designated the 'n'th bit (where 'n'=N−1) of a data symbol that is N-bit wide. The manipulation is then continued for the n−1 bit and so on until bit 1 (LSB+1 bit). The process for any bit level is described in more detail below.

Figure 1:
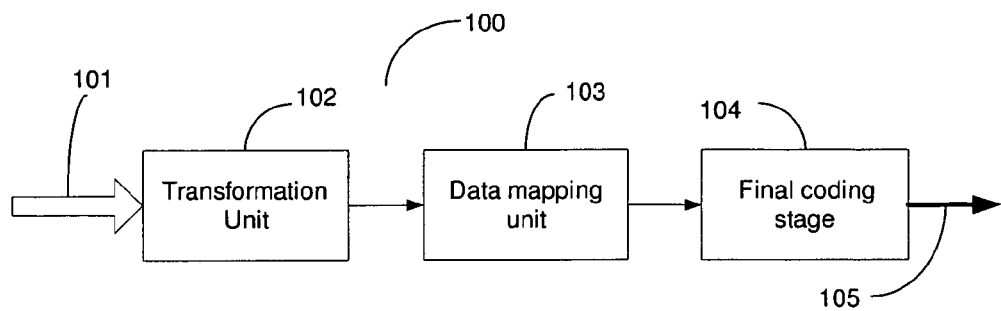
FIG. 1 is a block diagram representation of a prior art encoder.
Figure 2:
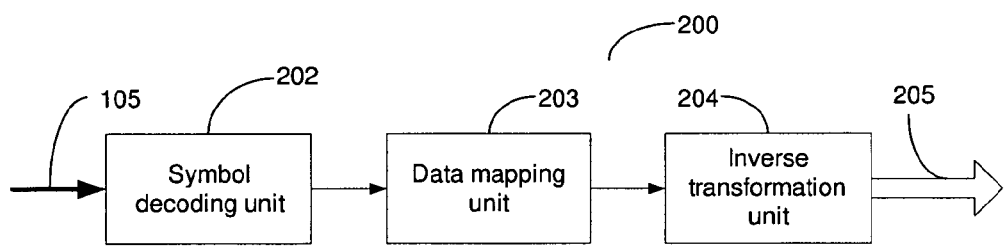
FIG. 2 is a block diagram representation of a prior art decoder.
Figure 3:
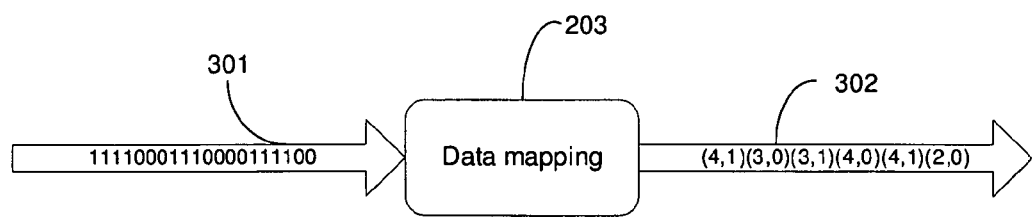
FIG. 3 is an example of simple run length coding.
Figure 4A:
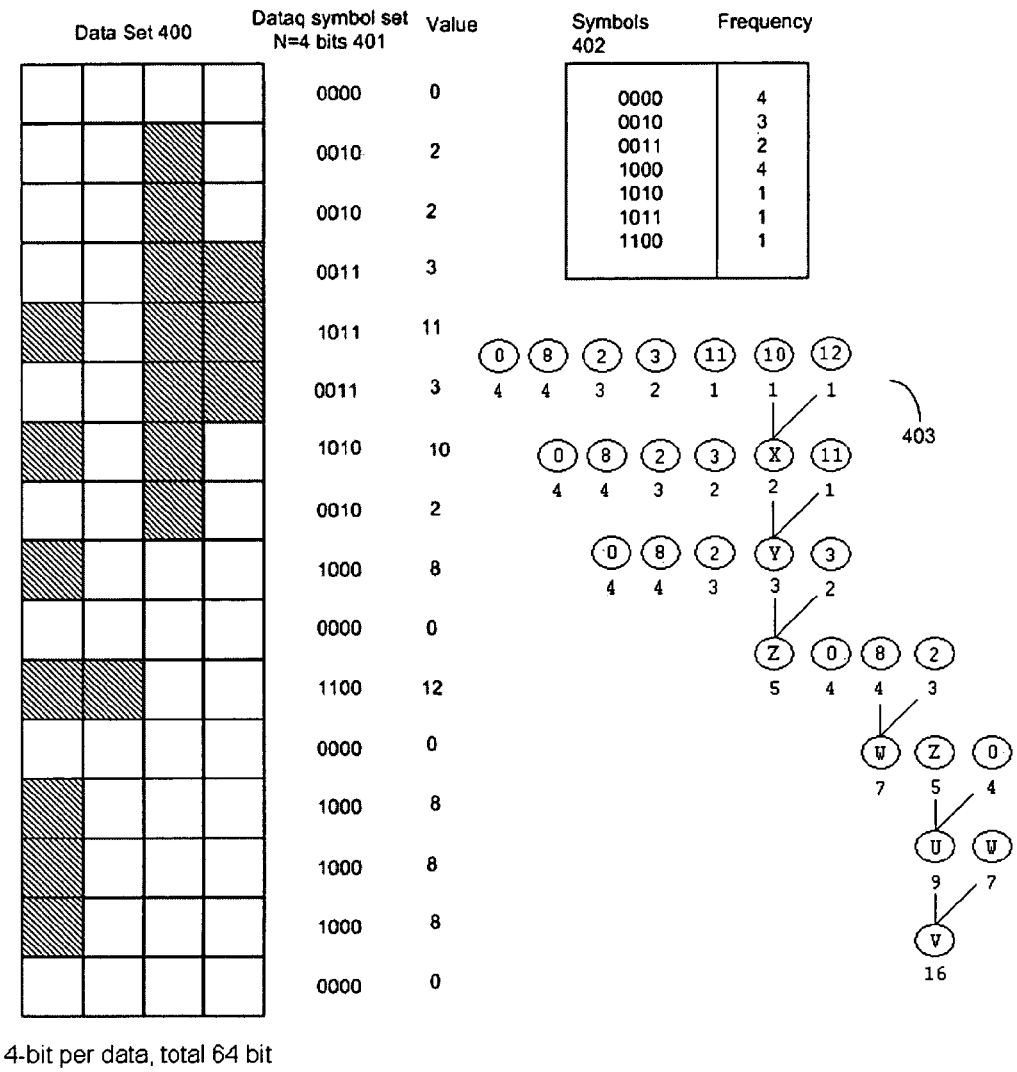
Figures 4B, 4C:
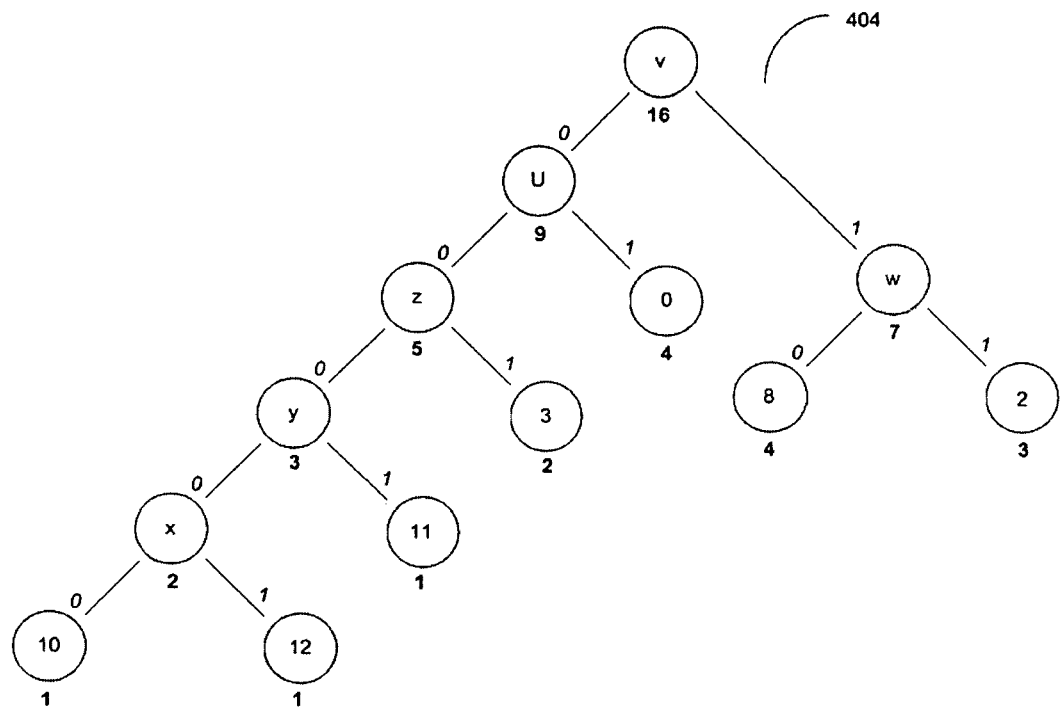
Figure 7:
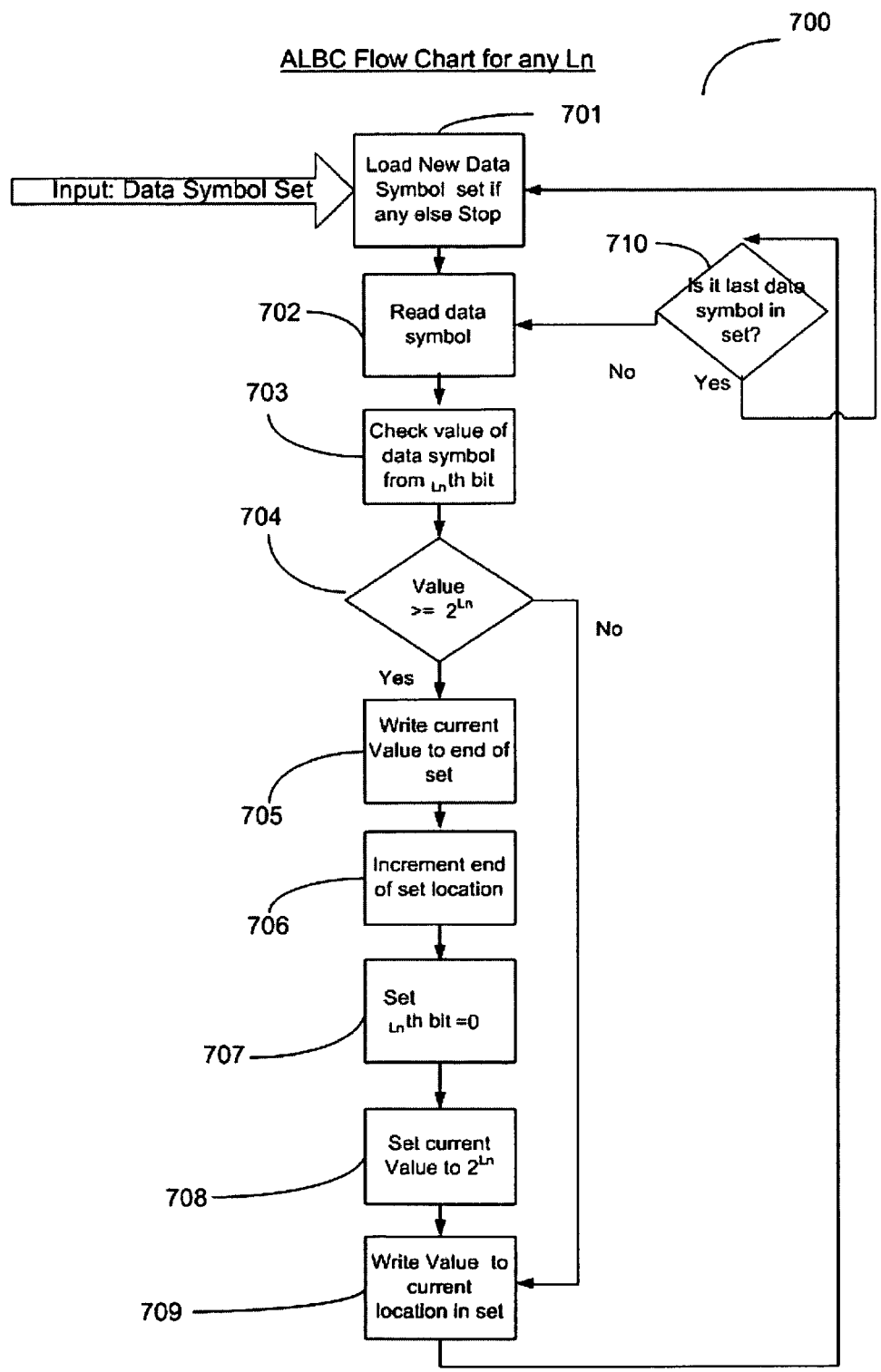
FIG. 7 is the flowchart showing the reduction of any one-level of data symbols.

The process of implementing this coding scheme at any individual level can be explained with respect of FIGS. 5, 6 and 7. The following example uses, without imposing limitation on the generality of the disclosed invention, a byte width of 4, which is selected merely for its ease of computation. The data symbol set is derived from the video data 400 shown in FIG. 4a. In a typical, but non-limiting, example, the data symbol set 401 is shown in the 1$^{st}$ column of FIG. 5, having a depth of 16, of 4-bit bytes. The values of each of the bytes, or data symbol, in the data symbol set are shown in the second column. These values go from 0 to 12 in this non-limiting example. In the 4-bit set shown, the individual data symbol values can be any value that is possible for a 4-bit byte, that is, the values can vary between decimal values of '0' and '15'. The aim of the processing is to reduce the possible values of the data symbols by reducing the allowed number of symbols 402. This reduces the number of symbol codes 405 that can be generated for a data symbol set. The example in FIG. 5 shows the reduction to the next level, Ln3, 501 in the case of the data symbol set of N=4 bit. The process is detailed also in the exemplary and non-limiting flowchart 700 of FIG. 7. The reduction process of the data symbol set is done in levels Ln, n having an initial value of 3 and going down to 1, in the current example. For any value of bit width N in the data symbol set, the first reduction level will be designated by Ln=N−1. Further reductions are possible by taking the next column of the generated data symbol set from Ln−1 for processing as Ln−2, then onwards until Ln=1 is reached. In the current example N=4 and hence the first reduction is designated Ln=3 for a reduction using bit 3 of the byte, followed by L2, the reduction of the bit 2, and then L1 for bit 1. The process can be repeated to any bit level, in accordance with the principles of the disclosed invention. The ALBCS transform is performed from the first level (Ln=3 for the given example) on the entire data set (for the given example as shown in FIG. 5). The process can be followed with respect to flowchart 700 shown in FIG. 7 and the following steps:

1. 701: Load data symbol set of N columns;
2. 702: Access the first data symbol of the data symbol set;
3. 703: Check the value of bits from n to 0; (the starting n=N−1);
4. 704: Check if the value of data symbol from n to 0 and compare with $2^{(Ln)}$, that is $2^3$ in the example;
5. If the value of the data symbol is greater than or equal to $2^{(Ln)}$, i.e., a value of 8 for Ln=3 in the example, then:
   a. 705: Copy original data symbol to end of data set;
   b. 706: Increment data symbol set length;
   c. 707: Set the MSB=0 at the new written location;
   d. 708: Change the original data symbol to $2^{(Ln)}$; and
   e. 709: Write the $2^{(Ln)}$ value back into the original location.
6. 709: If less than $2^{(Ln)}$ then retain the data symbol at the original location with no change;
7. 710: The next symbol from the symbol set is processed through the flow till the last symbol is reached; and
8. This process, when completed through step 7 above, for all symbols in the original data symbol set, limits the maximum value of the 4 bit data set to $2^{(Ln)}$, or 8 for the current example, instead of 15 in the original data symbol set. The process also generates a new data symbol set with a larger number of data symbols. The steps 1 through 7 may be repeated for all the data symbols in the original data set thereby limiting the maximum value of the data set and generating a new data set with a larger number of data symbols.

Therefore, the process can now be repeated for Ln=2, or the $3^{rd}$ bit of the new data symbol set, ignoring the presence of the $4^{th}$ bit of the data set. As a result the original data set causes a limit to the maximum value of the 4 bit data set to the value of 8 instead of the value of 15, and generating a new data set with a larger number of data symbols.

This will generate a new data symbol set that has only the following symbol values possible 8, 4, 3, 2, 1 and 0 from the original data symbol set. That is a reduction from a possible 16 symbol values, in the original set, to 6 values in the reduced set. The new data symbol set has a longer run but has limited the number of symbol codes needed. It is possible to use the new data symbol set to generate the necessary codes as shown in FIG. 6. As a comparison by using ALBC level 3 alone the bit count for transmission of the coded stream has reduced from 93 bits as in FIG. 4d to 65 bits as shown in FIG. 6. It is also possible to improve the compression by proceeding to the next levels of reduction as shown in FIG. 8. Here Ln=2 and hence the process followed is similar to the one for Ln=3, and then followed by the case of Ln=1. The advantage of this continued process is that the only possible symbols in the data symbol set will be for the N=4 system 8, 4, 2, 1 and 0, a set of five known and fixed values which can be easily coded.

Figure 9:
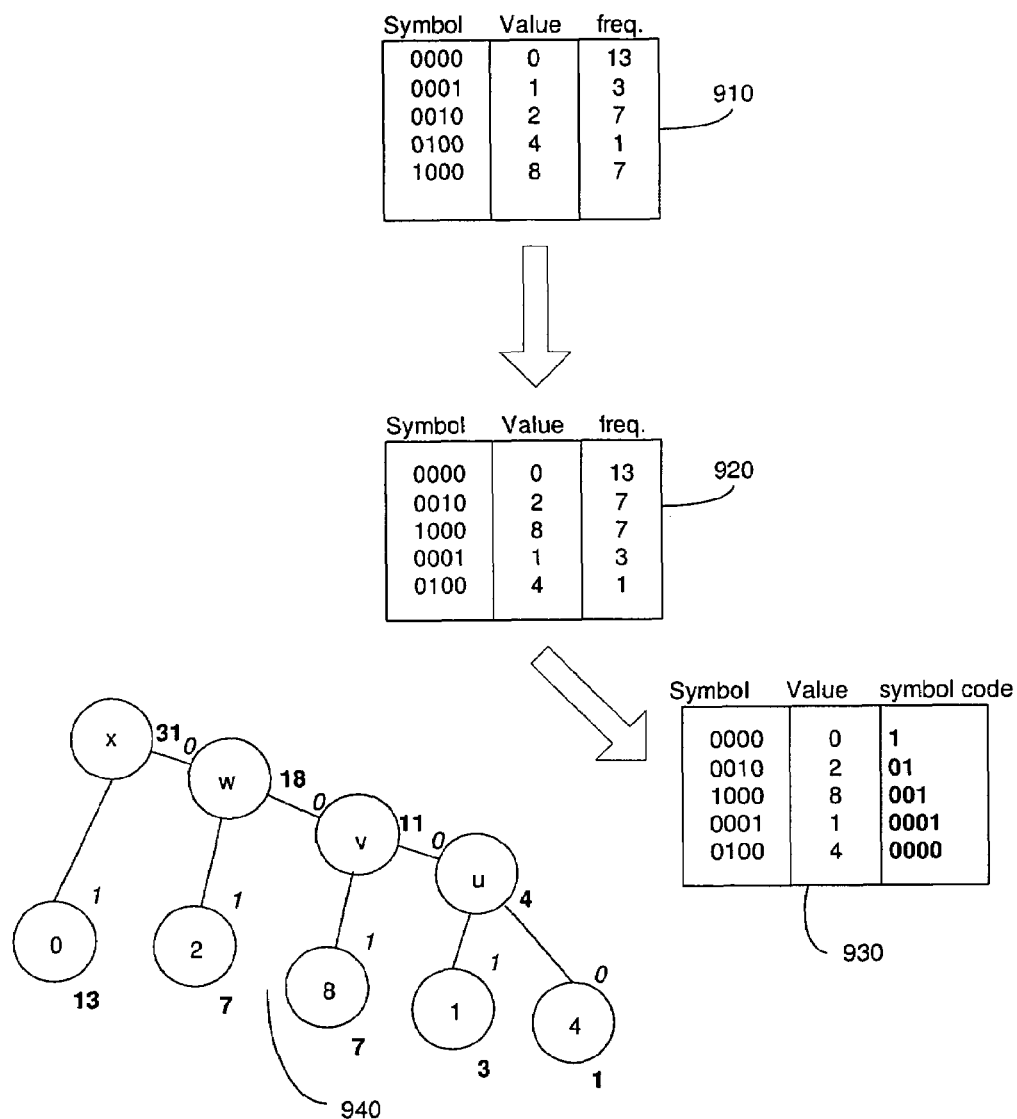
FIG. 9 is the typical code tree and fixed code that is generated from the symbols at reduction level L1.

The development of the fixed symbol codes from the use of the ALBC scheme is shown in FIG. 9. The frequency of each data symbol is shown as 910. This is ordered in terms of frequencies of occurrences from highest to lowest in 920. The automatically generated symbol codes generated using this ALBC scheme is given in 930. The possible generation of code using the normal code tree 940 shows the possible codes and match the automatically generated codes 930.

The ALBC decoding of the recovered data symbol set to retrieve the original data symbol set is by the reverse process. Since the original data symbol set is of fixed length it is possible to define the number of bytes to be recovered. The recovery process is by moving up from the last data symbol of the recovered data symbol set and comparing each column (Ln) from LSB to MSB in the data symbol set to determine if value of the Ln=L1 in the example equals 1 or 0. If 1 then next byte value at the bottom of the data symbol set is added back to the value of the byte and if 0 the byte is left alone. The added data symbol is deleted from the bottom of the set. This process is repeated for Ln=2 and Ln=3. The process of recovering the value of the original data symbol set (data recovery) is as shown in FIG. 10.

Referring again to FIG. 8, it will be noted that during coding, after processing for Ln=3, bit 3 in the added symbols is always 0, after processing for Ln=2, bits 3 and 2 in the added symbols are always 0, after processing for Ln=1, bits 3, 2 and 1 in the added symbols are always 0. Therefore in decoding as shown in FIG. 10, in the reverse process, for Ln=1, the symbols at the end of the left column are added to the symbols having a 1 for bit 1 starting with the last symbol in the left column having a 1 for bit 1. This starts with symbol 18, and for the whole column, applies the values of symbols 31-25. Then for Ln=2, the remaining (unused) symbols at the end of the center left column are added to the symbols having a 1 for bit 2 starting with the last symbol in the center column having a 1 for bit 2. This starts with symbol 20, the only symbol in the column that has a 1 for bit 2, and applies the value of symbol 24. For Ln=3, the remaining (unused) symbols at the end of the center right column are added to the symbols having a 1 for bit 3 starting with the last symbol in the right column having a 1 for bit 3. This starts with symbol 15, and applies the values of symbol 23-17, leaving the recovered data symbols in symbols 1-16 in the far right column.

Figure 12:
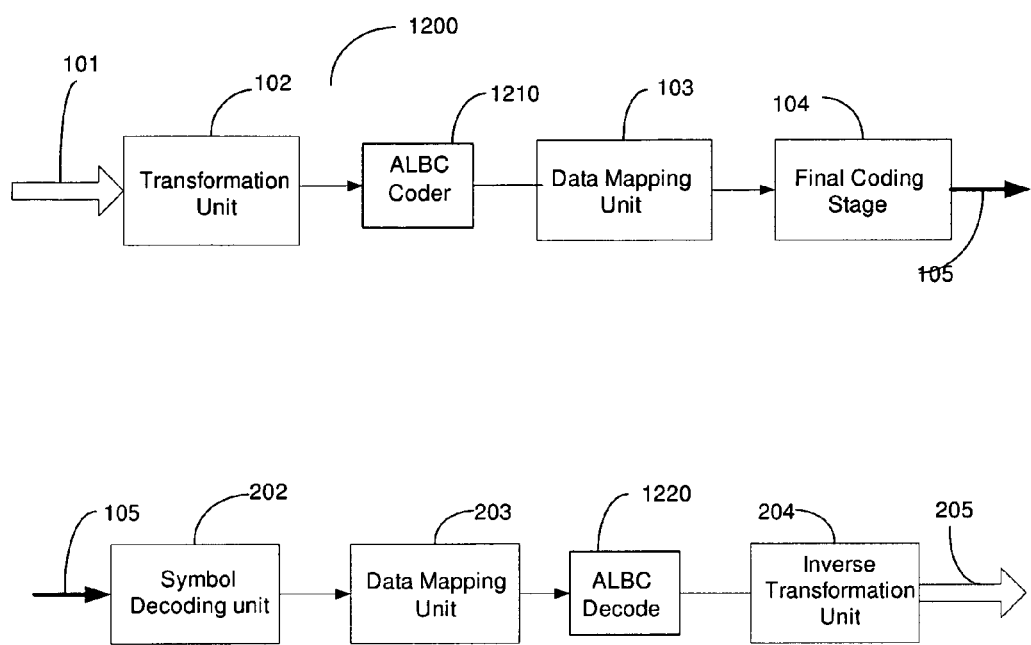
FIG. 12 is the block diagram of the proposed coder and decoder.

FIG. 12 shows the typical application of this ALBC method to improve the coding and compression in conjunction with existing methods typically run-length coding and other lossless and lossy coding methods. ALBC coder 1210 and ALBC decoder 1220 can be used with prior art coding scheme to improve the lossless coding efficiency as shown in FIG. 12.

FIG. 11 shows the reduction of the number of possible codes for a 16-bit wide data symbol set using the ALBCS. The variability of the codes is reduced or eliminated and the number of codes is reduced from 255 with no preprocessing to 9 with complete preprocessing. It is not necessary to proceed through the complete processing for achieving reductions, as would be clearly understood by those having skill-in-the-art. The process can be stopped at any value of Ln and the data symbol set generated. This data symbol set when processed, directly, or alternately through any of the existing lossless coding schemes provide substantial gains in run length and compression.

It is clearly seen that the maximum number of data symbols generated at any level of BRS processing is given by the following equation:

Number of data symbols generated=$2^{Ln}+(N-Ln)$ where
N=width of the original data symbol set,
Ln=the lowest bit level of the BRS processed The current invention provides a way of converting the data symbol stream into a longer run of a smaller number of symbols and hence codes used. Similar manipulation of the symbols in the data symbol set may be possible using other add or subtract-and-invert methods (for example changing the MSB to 0 and transferring the difference to form the last data symbol of the set instead of setting the MSB to 1 as in the example). These methods should be therefore considered to an integral part of the disclosed invention described herein above.

The disclosed apparatus and method may be implemented in hardware, software, firmware, or any combination thereof. When implemented in software, the invention uses an apparatus, for example a computer, to execute a sequence of instructions embodied in the software, such that the principles of the disclosed invention are achieved. When realized in software, the software would be in the form of a computer readable storage medium having stored thereon a sequence of instructions which, when executed by a computer, cause the computer to perform a method of the present invention.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A computer readable storage medium having stored thereon a sequence of instructions which, when executed by a computer, cause the computer to perform a method of increasing run length of symbols and reducing interdependencies between the symbols in a data symbol set comprising preprocessing of the symbols in the data symbol set, column-by-column, to reduce the number of symbols to be coded, and achieve a new compressed coded set from the data symbol set, such that decoding of the compressed coded set is possible without transmission of a code used to create the new compressed coded set.

2. The computer readable storage medium of claim 1, wherein the method comprises:
   accessing a data symbol of the data symbol set;
   checking values of bits from a most significant bit (MSB) to a least significant bit (LSB) of a respective level (Ln);
   if value of a data symbol is greater than or equal to $2^{(Ln)}$, then:
      copying said data symbol to end of data set from its original location;
      incrementing data symbol set length by one;
      setting MSB to '0';
      retaining all bit values from 'n−1'th to LSB;
      changing said data symbol to $2^{(Ln)}$; and
      writing said data symbol into said original location;
   otherwise, retaining said data symbol at said original location with no change; and
   repeating from accessing a data symbol step for each subsequent data symbol from said data symbol set until last data symbol is reached; and
   generating a new data set from the said data symbol set by the above process;
   such that said new data symbol set has a lower number of unique data symbols to be coded than said data symbol set.

3. The computer readable storage medium of claim 2, wherein the method further comprises:
   repeating steps of claim 1 for each data symbol of said new data symbol set, replacing said data symbol set with said new data symbol set, and using next column 'n−1' of bits and ignoring values of 1 or 0 existing after processing of a higher order bit.

4. The computer readable storage medium of claim 3, wherein the method further comprises:
   repeating steps of claim 1 and claim 2 such that said data symbol set is transformed into a new data symbol set with minimum number of unique data symbols that need to be coded.

5. The computer readable storage medium of claim 3, wherein the method further comprises:
   stopping at the end of any column process with associated reduction of number of unique data symbols that need to be coded prior to reaching a minimum number of unique data symbols that need to be coded.

6. The computer readable storage medium of claim 2, wherein said generating a new data symbol set increases the run length of data symbols in said new data symbol set.

7. A computer readable storage medium having stored thereon a sequence of instructions which, when executed by a computer, cause the computer to perform a method of increasing the orthogonality between data symbols to be coded by a pre-processing scheme comprising:
   accessing a first data symbol of the data symbol set;
   checking value of bits from MSB=n to LSB=0 to start the process for Ln;
   if value of data symbol is greater than or equal to $2^{(Ln)}$, then
      a. copying original data symbol to end of data set;
         incrementing data symbol set length by one;
         setting the MSB=0;
         retaining all bit from 'n−1'th bit=0 same;
      b. changing the data symbol to $2^{(Ln)}$; and
         writing into the original location;
   if value of data symbol is less than $2^{(Ln)}$ then retaining the data symbol at the original location with no change;
   repeating above process for the next data symbol from the data symbol set till the last data symbol is reached;
   generating a new data set from the original data set by the above process;
   repeating the process for each data symbol of the new data symbol set using next column 'n−1' of bits ignoring the values of 1 or 0 existing after processing of the higher order bit;
   continuing in the descending order of columns till n=1 ignoring the values of 1 or 0 existing after processing of the higher order bits; and
   generating a final data symbol set;
   such that the final data symbol set minimizes dependencies that existed between the data symbols of the original data set providing improved orthogonality between the data symbols for achieving optimum compression using any of the known compression methods.

8. An apparatus for increasing run length of symbols and reducing interdependencies between the symbols in a data symbol set, the apparatus comprises:

an interface for receiving the data symbol set;
a memory for at least storing the data symbol set and a new compressed coded set; and
a processor enabled to perform a preprocessing of the symbols in the data symbol set, column-by-column, to reduce the number of symbols to be coded, generate said new compressed coded set, and store said new compressed coded set in said memory;
such that decoding of said compressed coded set is possible without transmission of a code used to created said new compressed coded set.

9. A method of increasing run length of symbols and reducing interdependencies between the symbols in a data symbol set of M data symbols, each data symbol being N bits, numbered from N−1 to 0, comprising:
   a) for each data symbol of the data symbol set starting from the beginning of the data symbol set, checking the value of bit N−X, where X initially is 1;
   if the value of the data bit N−X is 0, leaving the data symbol unchanged;
   if the value of the data bit N−X is 1, then copying the data symbol with the bit N−X set to zero to the end of the data symbol set to increase the length of the data symbol set, and changing the value of the original data symbol to $2^{N-X}$;
   b) entropy coding the data symbol set resulting from a).

10. The method of claim 9 further comprising, after a), incrementing X and repeating a) before the entropy coding of b).

11. The method of claim 9 further comprising, after a), incrementing X and repeating a) a plurality of times, where X is incremented from 1 to a value of less than N, before the entropy coding of b).

12. A method of decoding a compressed entropy coded data symbol set to recover an original data symbol set of M data symbols, each data symbol being N bits, numbered from N−1 to 0, comprising:
   a) entropy decoding the entropy coded data symbol set to recover a data symbol set having a beginning and an end and a length L greater than M data symbols;
   b) starting with a predetermined value of X, where X ranges from a value of not less than 1 to N−1, and starting from the end of the data symbol set recovered in a), creating a new data symbol set by;
      1) finding the first data symbol from the end of the data symbol set having bit X=1, if any, and adding to that data symbol the value of the data symbol at the end of the data symbol set recovered in a) and then disregarding the data symbol at the end of the data symbol set to create a new data symbol set of length less than L;
      2) repeating 1) if and as required for each additional data symbol having bit X=1;
      3) if X is less than N−1, incrementing X and repeating 1) and 2), after which the remaining data symbol set is the original data symbol set.

13. A computer readable storage medium having stored thereon a sequence of instructions which, when executed by a computer, cause the computer to perform a method of increasing run length of symbols and reducing interdependencies between the symbols in a data symbol set of M data symbols, each data symbol being N bits, numbered from N−1 to 0, said method comprising:
   a) for each data symbol of the data symbol set, checking the value of bit N−X, where X initially is 1;
   if the value of the data bit N−X is 0, leaving the data symbol unchanged;
   if the value of the data bit N−X is 1, then copying the data symbol with the bit N−X set to zero to the end of the data symbol set to increase the length of the data symbol set, and changing the value of the original data symbol to
   b) entropy coding the data symbol set resulting from a).

14. The computer readable storage medium of claim 13 wherein the method comprises, after a), incrementing X and repeating a) before the entropy coding of b).

15. The computer readable storage medium of claim 13 wherein the method further comprises, after a), incrementing X and repeating a) a plurality of times, where X is incremented from 1 to a value of less than N, before the entropy coding of b).

16. A computer readable storage medium having stored thereon a sequence of instructions which, when executed by a computer, cause the computer to perform a method of decoding a compressed entropy coded data symbol set to recover an original data symbol set of M data symbols, each data symbol being N bits, numbered from N−1 to 0, the method comprising:
   a) entropy decoding the entropy coded data symbol set to recover a data symbol set having a beginning and an end and a length L greater than M data symbols;
   b) starting with a predetermined value of X, where X ranges from a value of not less than 1 to N−1, and starting from the end of the data symbol set recovered in a), creating a new data symbol set by;
      1) finding the first data symbol from the end of the data symbol set having bit X=1, if any, and adding to that data symbol the value of the data symbol at the end of the data symbol set recovered in a) and then disregarding the data symbol at the end of the data symbol set to create a new data symbol set of length less than L;
      2) repeating 1) if and as required for each additional data symbol having bit X=1;
      3) if X is less than N−1, incrementing X and repeating 1) and 2), after which the remaining data symbol set is the original data symbol set.

* * * * *